(12) United States Patent
Aryanfar et al.

(10) Patent No.: US 8,610,474 B2
(45) Date of Patent: Dec. 17, 2013

(54) SIGNAL DISTRIBUTION NETWORKS AND RELATED METHODS

(75) Inventors: Farshid Aryanfar, Sunnyvale, CA (US); Hae-Chang Lee, Los Altos, CA (US); Kun-Yung Chang, Los Altos, CA (US); Ting Wu, Sunnyvale, CA (US); Carl Werner, Los Gatos, CA (US); Masoud Koochakzadeh, Vista, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/498,884

(22) PCT Filed: Oct. 9, 2010

(86) PCT No.: PCT/US2010/052115
§ 371 (c)(1),
(2), (4) Date: Mar. 28, 2012

(87) PCT Pub. No.: WO2011/046845
PCT Pub. Date: Apr. 21, 2011

(65) Prior Publication Data
US 2012/0187988 A1  Jul. 26, 2012

Related U.S. Application Data

(60) Provisional application No. 61/252,126, filed on Oct. 15, 2009.

(51) Int. Cl.
*H03L 7/06* (2006.01)
(52) U.S. Cl.
USPC .......................................... 327/156; 327/147
(58) Field of Classification Search
USPC ................................................ 327/147, 156
See application file for complete search history.

(56) References Cited

U.S. PATENT DOCUMENTS

| 5,534,825 | A | 7/1996 | Goma et al. | 331/117 |
| 6,396,316 | B1 | 5/2002 | Cruz et al. | 327/112 |
| 6,426,661 | B1 | 7/2002 | Curran | 327/263 |
| 6,483,757 | B2 * | 11/2002 | Manning | 365/194 |

(Continued)

FOREIGN PATENT DOCUMENTS

WO    WO 2008-144152    11/2008    ............... H03L 7/24

OTHER PUBLICATIONS

Basit, Haris, "Practical Multi-Gigahertz Clocks for ASIC and COT Designs," DesignCon 2004 pp. 18.

(Continued)

*Primary Examiner* — Adam Houston
(74) *Attorney, Agent, or Firm* — Steven J. Cahill

(57) ABSTRACT

A signal distribution network has segments that each have a buffer circuit, a transmission line coupled to the buffer circuit, an inductor coupled to the buffer circuit through the transmission line, and a variable capacitance circuit coupled to the inductor and coupled to the buffer circuit through the transmission line. A capacitance of the variable capacitance circuit is set to determine a phase and an amplitude of a signal transmitted through the transmission line. A signal distribution network can include a phase detector, a loop filter circuit, and a resonant delay circuit. The phase detector compares a phase of a first periodic signal to a phase of a second periodic signal. The resonant delay circuit has a variable impedance circuit having an impedance that varies based on changes in an output signal of the loop filter circuit.

43 Claims, 11 Drawing Sheets

(56) References Cited

U.S. PATENT DOCUMENTS

| | | | | |
|---|---|---|---|---|
| 6,549,765 | B2* | 4/2003 | Welland et al. | 455/260 |
| 6,760,575 | B2* | 7/2004 | Welland | 455/260 |
| 6,798,256 | B1 | 9/2004 | Hazucha et al. | 327/111 |
| 6,882,182 | B1* | 4/2005 | Conn et al. | 326/93 |
| 7,353,011 | B2* | 4/2008 | Welland et al. | 455/258 |
| 7,391,251 | B1* | 6/2008 | Zhang et al. | 327/261 |
| 7,459,940 | B2 | 12/2008 | Franch | 326/97 |
| 7,511,588 | B2 | 3/2009 | Gabara | 331/117 |
| 8,198,930 | B2* | 6/2012 | Zerbe et al. | 327/261 |
| 2002/0008556 | A1* | 1/2002 | Manning | 327/158 |
| 2004/0135605 | A1 | 7/2004 | Chung et al. | 327/158 |
| 2005/0030076 | A1 | 2/2005 | Mohanavelu et al. | 327/165 |
| 2006/0097803 | A1* | 5/2006 | Wood | 331/57 |
| 2007/0103213 | A1* | 5/2007 | Wood | 327/156 |
| 2007/0209028 | A1 | 9/2007 | Restle | 716/13 |
| 2007/0285179 | A1* | 12/2007 | Ikeda et al. | 331/56 |
| 2008/0054966 | A1* | 3/2008 | Tamura | 327/158 |
| 2008/0079444 | A1* | 4/2008 | Denison | 324/679 |
| 2008/0079649 | A1* | 4/2008 | Mohamadi | 343/853 |
| 2008/0111633 | A1* | 5/2008 | Cranford et al. | 331/10 |
| 2008/0150605 | A1 | 6/2008 | Chueh et al. | 327/292 |
| 2008/0150668 | A1 | 6/2008 | Gabara | 336/200 |
| 2008/0169888 | A1* | 7/2008 | Chatwin et al. | 333/24 C |
| 2008/0303552 | A1 | 12/2008 | Chueh et al. | 326/93 |
| 2008/0303576 | A1 | 12/2008 | Chueh et al. | 327/299 |
| 2009/0027085 | A1 | 1/2009 | Ishii et al. | 326/93 |
| 2009/0207961 | A1* | 8/2009 | Sai | 375/375 |
| 2009/0231002 | A1 | 9/2009 | Poulton | 327/156 |
| 2009/0231005 | A1 | 9/2009 | Fujisawa et al. | 327/163 |
| 2010/0066416 | A1* | 3/2010 | Ohara et al. | 327/107 |
| 2010/0301910 | A1* | 12/2010 | Hu et al. | 327/156 |
| 2011/0215848 | A1* | 9/2011 | Koroglu et al. | 327/157 |
| 2011/0267212 | A1* | 11/2011 | Denison | 341/122 |
| 2012/0068743 | A1* | 3/2012 | Youssef et al. | 327/156 |
| 2012/0187988 | A1* | 7/2012 | Aryanfar et al. | 327/156 |
| 2012/0194236 | A1* | 8/2012 | Ficke et al. | 327/156 |
| 2012/0218001 | A1* | 8/2012 | Leibowitz et al. | 327/9 |
| 2012/0286882 | A1* | 11/2012 | Wood | 331/50 |
| 2013/0082790 | A1* | 4/2013 | Trivedi et al. | 331/117 FE |
| 2013/0106476 | A1* | 5/2013 | Joubert et al. | 327/156 |

OTHER PUBLICATIONS

Poulton, John, et al, "A 14-mW 6.25-Gb/s Transceiver in 90-nm CMOS", IEEE Journal of Solid-state circuits, vol. 42, No. 12, Dec. 2007, pp. 2745-2757.

PCT International Search report and the Written Opinion dated Jun. 23, 2011 re Int'l. Application No. PCT/US2010/052115. 8 Pages.

Krishnaswamy, Harish et al., "A Fully Integrated 24GHz 4-Channel Phased-Array transceiver in 0.13um CMOS Based on a Variable Phase Ring Oscillator and PLL Architecture", 2007 IEEE International Solid-State Circuits Conference, ISSCC 2007/Session 6/UWB and mm-Wave Communications Systems/6.7. 3 Pages.

O'Mahony, Frank et al., "A 10-GHz Global Clock Distribution Using Coupled Standing-Wave Oscillators", IEEE Journal of Solid-State Circuits, vol. 38, No. 11, Nov. 2003. 8 Pages.

Jose, Anup et al., "Distributed Loss-Compensation Techniques for Energy-Efficient Low-latency On-Cip Communication", IEEE Journal of Solid-State Circuits, vol. 42, No. 6, Jun. 2007. 10 Pages.

Balamurugan, Ganesh, et al., "A Scalable 5-15 Gbps, 14-75 mW Low-Power I/O Transceiver in 65 nm CMOS", IEEE Journal of Solid-State Circuits, vol. 43, No. 4, Apr. 2008. 10 Pages.

* cited by examiner

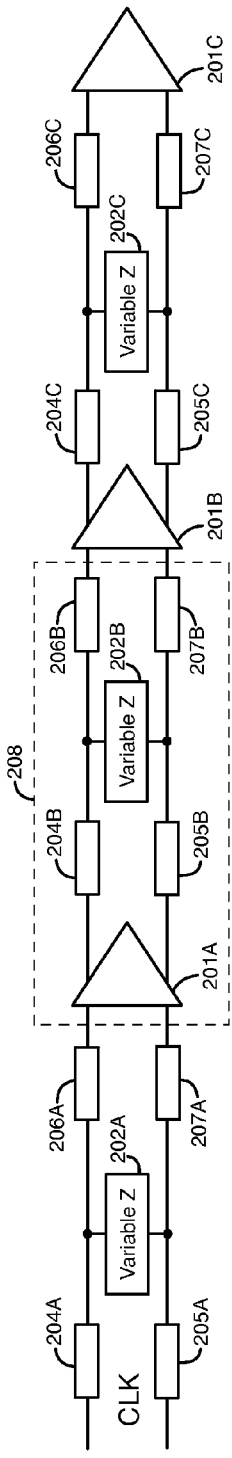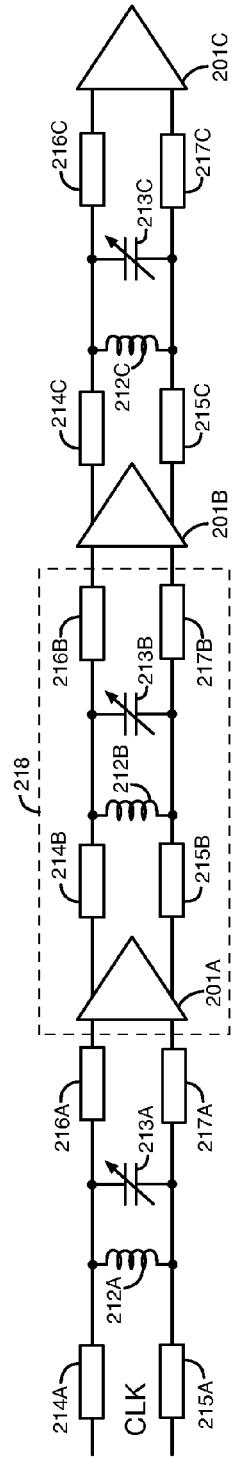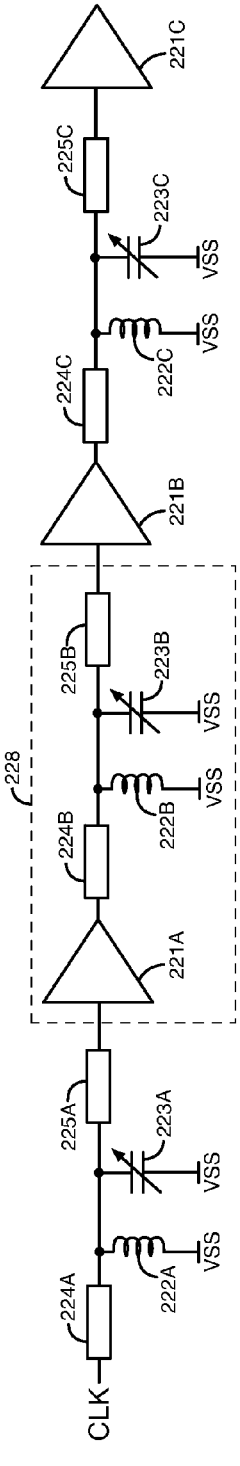

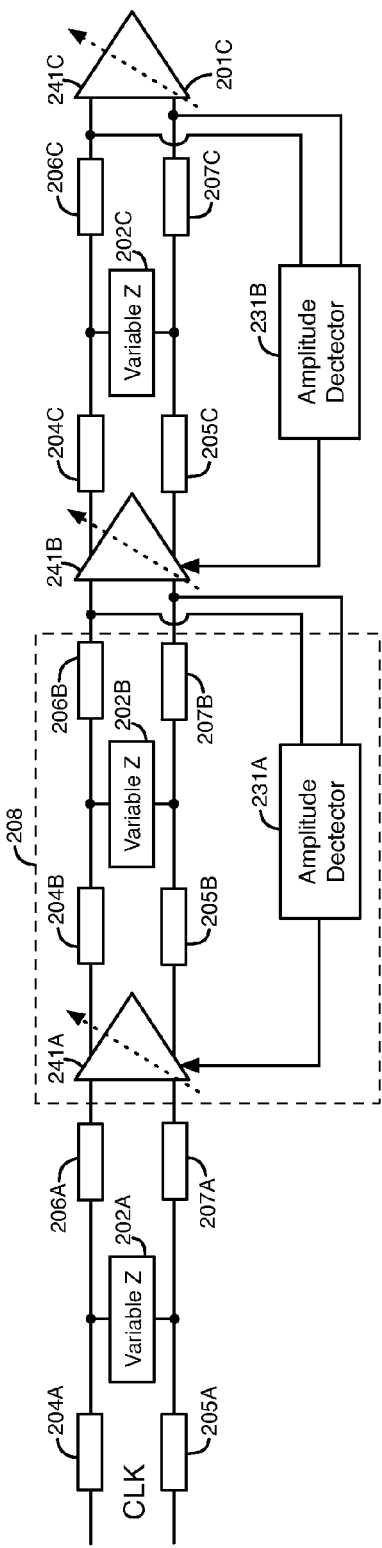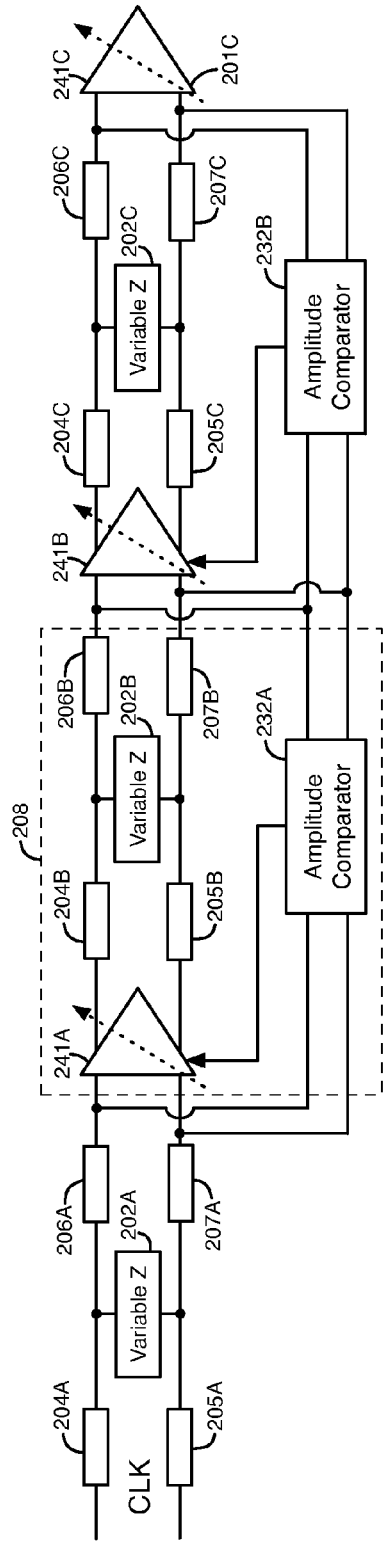
FIG. 2D
FIG. 2E

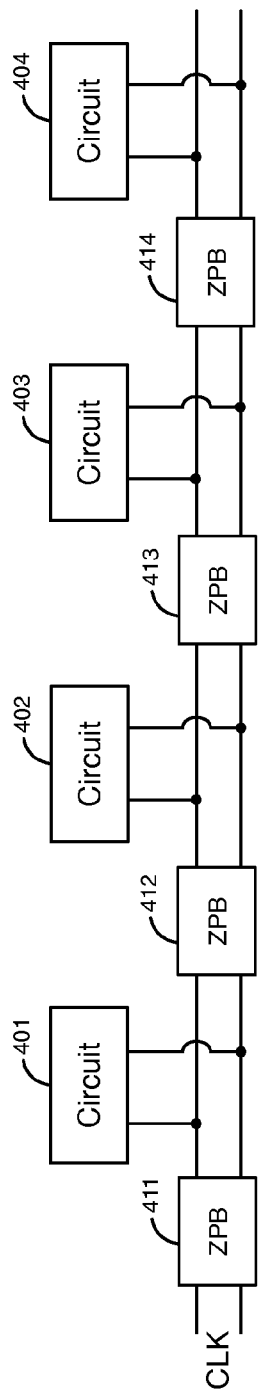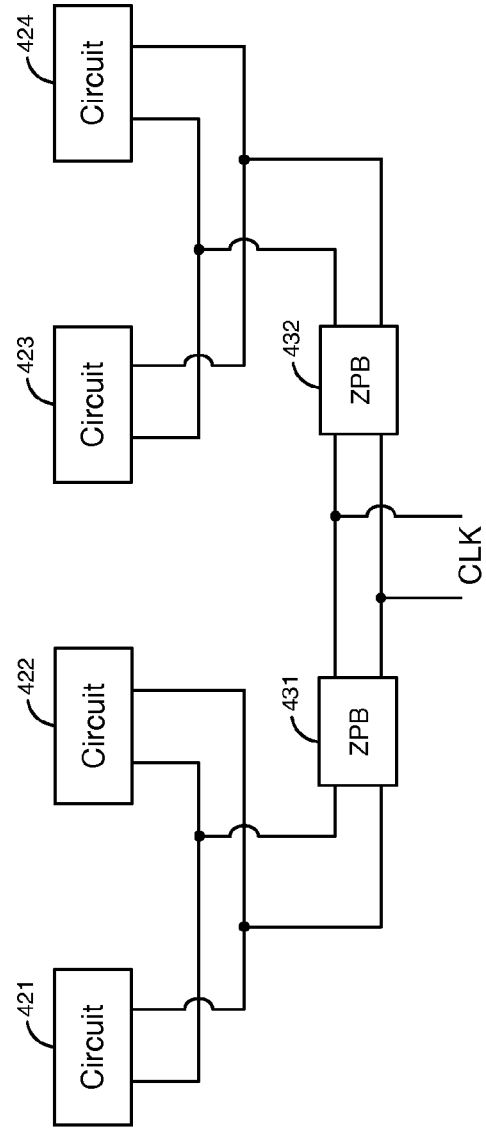
FIG. 4A
FIG. 4B

SIGNAL DISTRIBUTION NETWORKS AND RELATED METHODS

CROSS REFERENCE TO RELATED APPLICATION

This patent application claims the benefit of U.S. provisional patent application 61/252,126, filed Oct. 15, 2009, which is incorporated by reference herein in its entirety.

TECHNICAL FIELD

This disclosure relates to electronic circuits, and more particularly, to signal distribution networks and related methods.

BACKGROUND

Many integrated circuits use clock distribution networks to distribute clock signals to a multitude of circuit components on the die. Many techniques for distributing high frequency clock signals in an integrated circuit generate clock skew.

FIG. 1A illustrates an example of the clock skew that a typical prior art clock distribution network generates in a clock signal transmitted through the network. As the clock signal propagates through the clock distribution network, the phase of the clock signal can become significantly offset relative to its starting phase. In the example of FIG. 1A, the phase of the clock signal becomes offset by 200° from its starting phase. In the graphs shown in FIGS. 1A and 1B, the horizontal axes represent the length of the clock network.

A delay-locked loop can be coupled to a clock distribution network to reduce the clock skew and to reduce voltage amplitude variations in a clock signal. However, a conventional delay-locked loop uses several delay circuits to generate an output clock signal. The delay circuits consume power and add power supply induced jitter into the output clock signal.

The distribution of a high frequency clock signal in an integrated circuit can generate significant variations in the voltage amplitude of the clock signal. FIG. 1B illustrates an example of the variations in the voltage amplitude of a clock signal transmitted through a typical prior art clock distribution network. In this example, the voltage amplitude of the clock signal attenuates along the length of the clock distribution network. In the examples of FIG. 1A-1B, the clock distribution networks are terminated.

Many clock distribution network designs, such as H-tree and meshed clock networks, consume a large amount of power and die area on the integrated circuit. Also, many clock distribution networks, such as H-tree clock networks, can be laid out on an integrated circuit in only one configuration or in only a limited number of configurations.

BRIEF DESCRIPTION OF THE DRAWINGS

FIG. 2A illustrates an example of a differential signal distribution network having buffer circuits and variable impedance circuits.

FIG. 2B illustrates an example of a differential signal distribution network having buffer circuits and tuning circuits.

FIG. 2C illustrates an example of a single-ended signal distribution network having buffer circuits and tuning circuits.

FIG. 2D illustrates an example of a differential signal distribution network having variable impedance circuits, variable gain buffer circuits, and amplitude detectors that control the gain of the variable gain buffer circuits.

FIG. 2E illustrates an example of a differential signal distribution network having variable impedance circuits, variable gain buffer circuits, and amplitude comparators that control the gain of the variable gain buffer circuits.

FIG. 4A illustrates an example of a linear clock network implementation for the signal distribution networks of FIGS. 2A-2B.

FIG. 4B illustrates an example of an H-tree clock network implementation for the signal distribution networks of FIGS. 2A-2B.

DETAILED DESCRIPTION

Figure 1A:
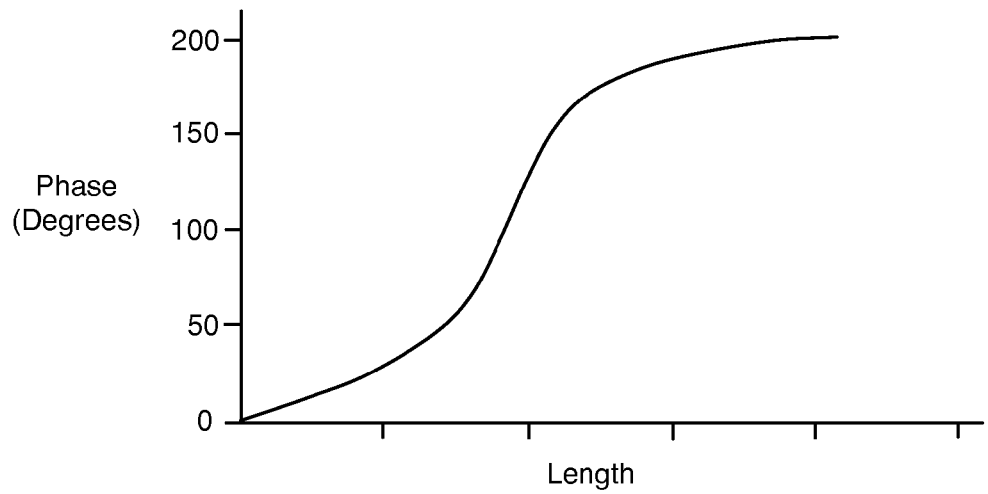
FIG. 1A illustrates an example of the clock skew that a typical prior art clock distribution network generates in a clock signal transmitted through the network.
Figure 1B:
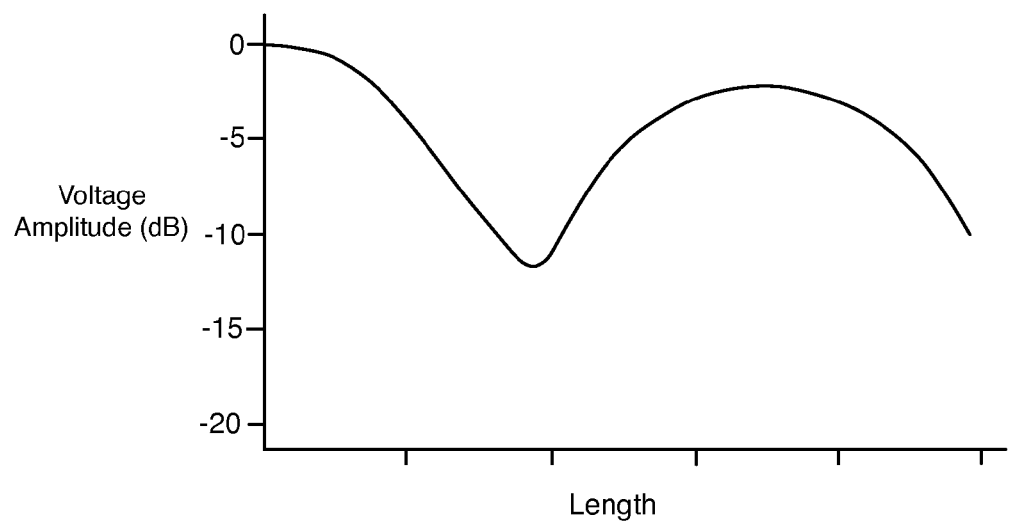
FIG. 1B illustrates an example of the variations in the voltage amplitude of a clock signal transmitted through a typical prior art clock distribution network.

A signal distribution network includes buffer circuits that are coupled at regular intervals along the length of the network. The buffer circuits boost the voltage amplitude of signals transmitted through the network. Variable impedance circuits are coupled to the buffer circuits in the signal distribution network. The impedances of the variable impedance circuits are adjusted to reduce phase offsets in signals transmitted through the signal distribution network. The variable impedance circuits can have variable capacitances and/or variable inductances. The signal distribution network can be used to transmit signals having a wide frequency range. The signal distribution network can be routed through an integrated circuit in many different routing configurations.

A signal distribution network can include a delay-locked loop (DLL) that has a resonant circuit. The resonant circuit includes a variable impedance circuit. The DLL varies the impedance of the variable impedance circuit to reduce the phase offset in a signal transmitted through the network. The resonant frequency of the resonant circuit is slightly higher than the frequency of the signal transmitted through the network. As a result, the resonant circuit introduces a negative phase offset into the signal that cancels positive phase offsets in the signal through the distribution network. A buffer circuit can be coupled to the DLL to boost the voltage of the signal. A single buffer circuit consumes less power and introduces less power supply induced jitter (PSIJ) into the signal than a delay chain having several buffer circuits.

FIG. 2A illustrates an example of a differential signal distribution network having buffer circuits 201 and variable impedance circuits 202 that are coupled together via transmission lines 204-207. FIG. 2A illustrates three buffers 201A-201C, three variable impedance circuits 202A-202C, and parallel transmission lines 204A-207C that are coupled along the length of a differential signal distribution network as an example. The signal distribution network of FIG. 2A has multiple segments that are coupled in series. Each segment of the signal distribution network of FIG. 2A includes one buffer circuit 201, one variable impedance circuit 202, and parallel transmission lines 204-207. The segment 208 shown in FIG. 2A includes buffer 201A, variable impedance circuit 202B, and parallel transmission lines 204B-207B.

The differential inputs and differential outputs of buffer circuits 201 are coupled together by parallel transmission lines 204-207. A signal distribution network can include any suitable number of segments 208 coupled along the length of the signal distribution network as shown in FIG. 2A.

Buffer circuits 201 compensate for the loss in the voltage amplitude of signals that are transmitted through the signal distribution network. For example, buffer circuits 201A-201C buffer the voltage of a differential periodic input clock signal (CLK) as it is transmitted through the signal distribution network as shown in FIG. 2A. In one embodiment, each of the buffer circuits 201 has a variable gain.

Variable impedance circuits 202 remove the amplitude nulls by canceling leaked current through the capacitance of the signal distribution network. Buffers circuits 201 and parallel transmission lines 204-207 cause clock signal CLK to experience a positive phase offset as CLK propagates through the signal distribution network of FIG. 2A. Variable impedance circuits 202 cause the phase offset of the clock signal CLK transmitted through the signal distribution network to be more linear.

In one embodiment, variable impedance circuits 202 compensate for all of the phase variation of the clock signal CLK. In this embodiment, each of the N variable impedance circuits 202 compensates for 1/N of the total phase offset introduced by each segment of the signal distribution network including one of the buffer circuits 201.

In another embodiment, the variable impedance circuits 202 cause clock signal CLK to have phase variations between two or more of the variable impedance circuits 202. For example, the signal distribution network of FIG. 2A may generate a phase change in clock signal CLK between variable impedance circuit 202A and variable impedance circuit 202B.

The phase of clock signal CLK along the length of the signal distribution network of FIG. 2A can be adjusted by varying the impedances of variable impedance circuits 202. Variable impedance circuits 202 can each include, for example, an inductor and a variable capacitance circuit. FIG. 2B illustrates an example of a differential signal distribution network having buffer circuits 201, inductors 212, variable capacitance circuits 213, and transmission lines 214-217.

FIG. 2B illustrates three buffer circuits 201A-201C, three inductors 212A-212C, three variable capacitance circuits 213A-213C, and parallel transmission lines 214A-217C that are coupled along the length of a signal distribution network as an example. Each of the variable impedance circuits 202 of FIG. 2A can include, for example, an inductor 212 and a variable capacitance circuit 213, as shown in FIG. 2B. Each of the variable capacitance circuits 213 is coupled in parallel with one of the inductors 212, as shown in FIG. 2B.

The signal distribution network of FIG. 2B has multiple segments that are coupled in series. Each segment of the signal distribution network of FIG. 2B includes one buffer circuit 201, one inductor 212, one variable capacitance circuit 213, and parallel transmission lines 214-217. The segment 218 shown in FIG. 2B includes buffer circuit 201A, inductor 212B, variable capacitance circuit 213B, and parallel transmission lines 214B-217B.

Each inductor 212 and each variable capacitance circuit 213 is coupled across the differential transmission lines in each segment of the signal distribution network. Although only three full segments are shown in each of FIGS. 2A-2B, a signal distribution network having techniques described herein can include any desired number of segments.

The capacitances of variable capacitance circuits 213 can be adjusted to select a desired phase variation in clock signal CLK along the length of the signal distribution network. For example, the capacitances of variable capacitance circuits 213A and 213B can be adjusted to achieve a desired phase shift in CLK between variable capacitance circuit 213A and variable capacitance circuit 213B.

According to another embodiment, inductors 212 have variable inductance values. An inductor 212 can be designed to have a variable inductance, for example, by using switches to couple additional turns to a coil in the inductor. As another example, an inductor 212 can have a variable inductance by coupling the inductor 212 to another inductor and tuning the inductance of the resulting transformer.

In an embodiment having variable inductance inductors 212, the inductances of inductors 212 can be adjusted to vary the phase of the clock signal CLK along the length of the signal distribution network. For example, the inductances of inductors 212A and 212B can be adjusted to achieve a desired phase shift in CLK between inductor 212A and inductor 212B.

In another embodiment, both the capacitances of variable capacitance circuits 213 and the inductances of inductors 212 are adjusted to achieve a desired phase shift in clock signal CLK along the length of the signal distribution network.

Each of the inductors 212 coupled in parallel with one of the variable capacitance circuits 213 form a resonant circuit. For example, inductor 212A and variable capacitance circuit 213A are a first resonant circuit, inductor 212B and variable capacitance circuit 213B are a second resonant circuit, etc.

In some embodiments, the inductances of inductors 212 and the capacitances of variable capacitance circuits 213 are set to values that cause the resonant frequency $\omega_R$ of the resonant circuits in the signal distribution network to be greater than the angular frequency $\omega$ of clock signal CLK (i.e., off resonance). As a result, inductors 212 and variable capacitance circuits 213 introduce a negative phase offset in clock signal CLK.

The negative phase offset introduced into CLK by inductors 212 and variable capacitance circuits 213 being tuned to off resonance values compensates for the positive phase offset introduced into CLK by buffers 201 and parallel transmission lines 214-217. In some embodiments, inductors 212 and variable capacitance circuits 213 are tuned to off resonance values that introduce a negative phase offset into CLK that compensates for 100% of the positive phase offset introduced into CLK by buffers 201 and parallel transmission lines 214-217 in the signal distribution network of FIG. 2B.

In some embodiments, the inductances of inductors 212 and the capacitances of variable capacitance circuits 213 are set to values that cause the resonant frequency $\omega_R$ of the resonant circuits to be only slightly greater than the angular frequency $\omega$ of clock signal CLK. When $\omega_R$ is closer to the angular frequency $\omega$ of CLK, the resonant circuits consume less power, but the resonant circuits introduce less negative phase offset into the phase of CLK.

Signal distribution networks that have longer transmission lines in each segment generate a larger positive phase shift in CLK and therefore need more negative phase offset to compensate for 100% of the positive phase shift in CLK. For these signal distribution networks, $\omega_R$ must be set farther from the $\omega$ of CLK to generate the compensating negative phase shift.

FIG. 2C illustrates an example of a single-ended signal distribution network having buffer circuits and resonant circuits. The single-ended signal distribution network of FIG. 2C includes buffer circuits 221A-221C, inductors 222A-222C, variable capacitance circuits 223A-223C, and transmission lines 224A-224C and 225A-225C.

The signal distribution network of FIG. 2C has multiple segments that are coupled in series. Each segment of the single-ended signal distribution network includes a buffer 221, an inductor 222, a variable capacitance circuit 223, and transmission lines 224-225. The segment 228 shown in FIG. 2C includes buffer circuit 221A, inductor 222B, variable capacitance circuit 223B, and transmission lines 224B and 225B. Although only three full segments are shown in FIG. 2C, a signal distribution network having techniques described herein can include any desired number of segments.

Buffers 221 are coupled together by single-ended transmission lines 224-225. Buffers 221 drive a single-ended clock signal CLK through the signal distribution network. The inductor 222 and variable capacitance circuit 223 in each segment of the network are coupled between transmission lines 224-225 and a node at voltage VSS. VSS can be a ground voltage or any other low impedance voltage reference. Buffers 221 and other buffer circuits described herein are driven by the voltage difference between a supply voltage VCC and voltage VSS. The inductor 222 and variable capacitance circuit 223 in each segment of the network form a resonant circuit. Inductors 222 can have variable inductance values.

FIG. 2D illustrates an example of a differential signal distribution network that includes amplitude detector circuits 231A, 231B, etc. (collectively referred to as amplitude detector circuits 231). The signal distribution network of FIG. 2D includes all of the circuits shown in FIG. 2A, except that in FIG. 2D, buffers 201A-201C, etc. are replaced by variable gain buffers 241A-241C, etc. (i.e., buffers 241).

In order to keep the effects of signal attenuation due to RC distortion along the signal distribution network of FIG. 2D within an acceptable range, the amplitude of the differential output signal of the buffer 241 in each segment of the network is controlled by tuning the gain of the buffer 241 in that segment. In FIG. 2D, amplitude detector circuits 231 tune the gains of buffers 241.

Each of the amplitude detector circuits 231 compares the differential output signal of one of buffers 241 after being transmitted through transmission lines 204-207 to a reference level. For example, amplitude detector circuit 231A compares the differential output signal of buffer 241A to a reference level after the differential output signal of buffer 241A has passed through transmission lines 204B-207B in segment 208. Amplitude detector circuits 231 can measure the amplitudes of the output signals of buffers 241 using, for example, an envelope detector or a self mixing technique followed by a low pass filter.

Each amplitude detector circuit 231 generates an output signal that varies the gain of a buffer 241 based on changes in the amplitude of the differential output signal of the buffer 241. Amplitude detector circuits 231 can, for example, adjust the gains of buffers 241 to reduce or eliminate variations in the amplitudes of the output signals of buffers 241 between the different segments of the network.

FIG. 2E illustrates an example of a differential signal distribution network that includes amplitude comparator circuits 232A, 232B, etc. (collectively referred to as amplitude comparator circuits 232). The signal distribution network of FIG. 2E includes all of the circuits shown in FIG. 2A, except that in FIG. 2E, buffers 201A-201C, etc. are replaced by variable gain buffers 241A-241C, etc.

Each of the amplitude comparator circuits 232 compares the differential output signals of two adjacent buffers 241. For example, amplitude comparator circuit 232B compares the differential output signal of buffer 241A after being transmitted through transmission lines 204B-207B to the differential output signal of buffer 241B after being transmitted through transmission lines 204C-207C. Amplitude comparator circuits 232 can measure the amplitudes of the output signals of buffers 241 using, for example, an envelope detector or a self mixing technique followed by a low pass filter.

Each amplitude comparator circuit 232 generates an output signal that varies the gain of a buffer 241 based on changes in the difference between the amplitudes of the differential output signals of two adjacent buffers 241. Each amplitude comparator circuit 232 can, for example, adjust the gain of a buffer 241 to drive the amplitude of the output signal of that buffer 241 to equal the amplitude of the output signal of the buffer 241 in the previous segment of the network.

According to additional embodiments, an amplitude detector circuit or an amplitude comparator circuit is coupled to each segment of a single-ended signal distribution network to reduce or eliminate variations in the voltage amplitude of a signal transmitted through the network. The amplitude detector circuit in each segment of a single-ended signal distribution network tunes the gain of a single-ended variable gain buffer circuit in that segment in response to the single-ended output signal of the buffer circuit. The amplitude comparator circuit in each segment of a single-ended signal distribution network tunes the gain of a single-ended variable gain buffer circuit in that segment in response to a comparison between the single-ended output signal of the buffer circuit and the single-ended output signal of a buffer circuit in a previous segment of the network.

Figure 3A:
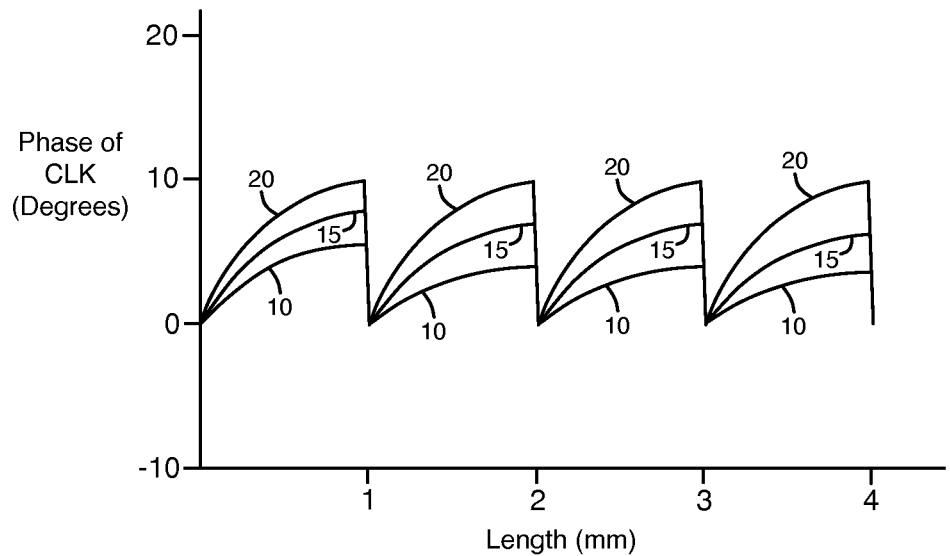
FIG. 3A is a graph that illustrates examples of how the phase of a clock signal varies in an embodiment of the signal distribution network of FIG. 2B in which the tuning circuits introduce a negative phase offset into the clock signal that compensates for all of the positive phase offset in the clock signal.

FIG. 3A is a graph that illustrates examples of how the phase of clock signal CLK varies in an embodiment of the signal distribution network of FIG. 2B in which the resonant circuits introduce a negative phase offset into CLK that compensates for all of the positive phase offset in CLK. FIG. 3A illustrates three curves for the phase of clock signal CLK at three different frequencies, 10 GHz, 15 GHz, and 20 GHz of CLK. Buffers 201 and the transmission lines cause the phase of CLK to become increasingly offset relative to its starting phase as CLK propagates through the signal distribution network of FIG. 2B. When CLK reaches a variable impedance circuit formed by an inductor 212 and a variable capacitance circuit 213 in each segment of the network, the phase of CLK returns to its starting phase. This phase adjustment is shown as the phase of CLK rapidly returning to 0 degrees in FIG. 3A (e.g., at 1 mm in FIG. 3A).

In other embodiments, inductors 212 and variable capacitance circuits 213 are tuned to off resonance values that introduce a phase offset into CLK that either increases or decreases the positive phase offset introduced into CLK by the signal distribution network of FIG. 2B to set the total phase offset at a desired value. In these embodiments, the signal distribution network of FIG. 2B generates a desired phase offset in CLK that accumulates as CLK propagates through each additional segment of the network.

Figure 3B:
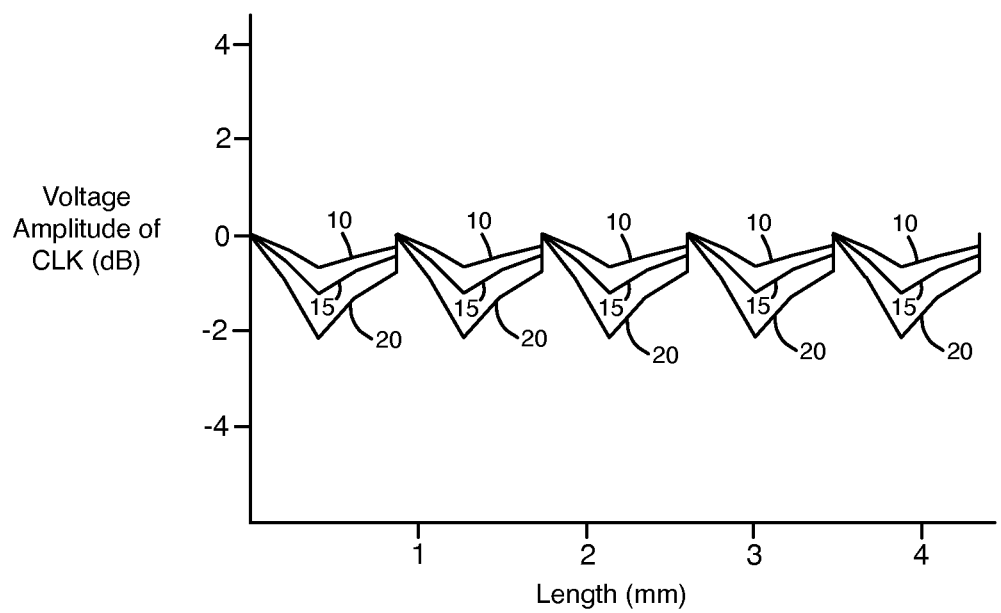
FIG. 3B is a graph that illustrates examples of how the loss in the voltage amplitude of a clock signal is compensated as it is transmitted through the signal distribution network of FIG. 2B.

FIG. 3B is a graph that illustrates examples of how the loss in the voltage amplitude of a clock signal is compensated as it is transmitted through the signal distribution network of FIG. 2B. FIG. 3B illustrates three curves for the voltage amplitude of clock signal CLK at three different frequencies, 10 GHz, 15 GHz, and 20 GHz of CLK. The transmission line conductors in the signal distribution network have impedance that decreases the voltage amplitude of clock signal CLK as CLK propagates through the network. Buffers 201 increase the voltage amplitude of CLK back to its starting voltage in each segment of the signal distribution network, as shown in FIG. 3B.

The principles set forth in FIGS. 2A-2C can be applied to signal distribution networks having an arbitrary routing length or topology. Because the variable impedance circuits can be tuned (either severally or together), the principles set forth in FIGS. 2A-2C can be applied to any transmission line or other clock routing scheme. For example, the signal distribution networks of FIGS. 2A-2C can be used in an H-tree clock network, a mesh clock network, and a linear clock network. The signal distribution networks of FIGS. 2A-2C can also transmit clock signals that have a wide range of frequencies.

The signal distribution networks of FIGS. 2A-2C are modulator in design in the sense that the signal distribution networks have multiple segments, such as segments 208, 218, and 228 respectively, having the same circuit components coupled in the same configuration. The segments in FIGS. 2A-2C can be repeated numerous times to achieve networks having any desired shape and length. The variable impedance circuits in the segments can be tuned in unison, or alternatively, the variable impedance circuits in the segments can be tuned separately.

FIG. 4A illustrates an example of a linear clock network implementation for the signal distribution networks of FIGS. 2A-2B. The clock network of FIG. 4A includes multiple circuits 401-404 etc. (e.g., data transceiver circuits) that receive a differential clock signal CLK transmitted through a differential signal distribution network. Multiple zero phase buffer (ZPB) circuit blocks 411-414 etc. form the differential signal distribution network of FIG. 4A. Each of the ZPB blocks 411-414 can include one or more of the segments 208 or 218 shown in FIGS. 2A-2B.

Standard H-tree clock networks used in conventional systems reduce clock skew. However, standard H-tree clock networks typically consume substantially more die area than the clock network of FIG. 4A. The signal distribution networks of FIGS. 2A-2C eliminate the need for using an H-tree clock network to reduce clock skew.

However, the signal distribution networks of FIGS. 2A-2C can be used in a clock network having an H-tree structure. FIG. 4B illustrates an example of an H-tree clock network implementation for the signal distribution networks of FIGS. 2A-2B. The clock network of FIG. 4B includes multiple circuits 421-424 etc. that receive a differential clock signal CLK transmitted through a differential signal distribution network. Multiple ZPB circuit blocks 431-432 etc. are coupled to the differential signal distribution network of FIG. 4B. Each of the ZPB blocks 431-432 can include one or more of the segments 208 or 218 shown in FIGS. 2A-2B.

Figure 5:
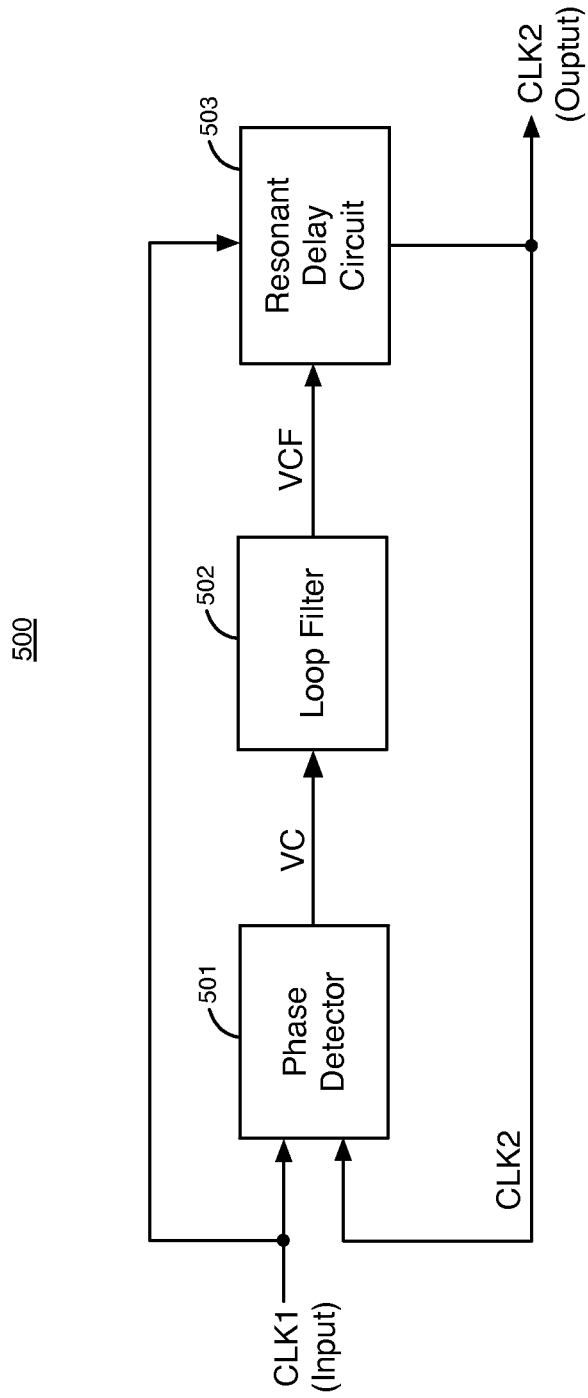
FIG. 5 illustrates an example of a delay-locked loop (DLL) circuit that has a resonant delay circuit.

In some applications, a delay-locked loop is coupled to a signal distribution network to remove a phase offset in a clock signal that is transmitted through the signal distribution network. FIG. 5 illustrates an example of a delay-locked loop (DLL) circuit 500 that has a resonant delay circuit. DLL 500 can be coupled to a signal distribution network to align the phases of clock signals at two different locations along the network to remove a phase offset in one of the clock signals.

DLL 500 includes a phase detector 501, a loop filter circuit 502, and a resonant delay circuit 503. Phase detector 501 compares the phase of a periodic feedback clock signal CLK2 to the phase of a periodic input reference clock signal CLK1. Phase detector 501 generates a control signal VC that varies based on the phase difference between CLK1 and CLK2. Loop filter 502 is coupled to the output of phase detector 501 and to the control input of resonant delay circuit 503. Loop filter 502 filters control signal VC to generate a filtered control signal VCF.

Filtered control signal VCF is transmitted to the control input of resonant delay circuit 503. Resonant delay circuit 503 delays CLK1 to generate feedback clock signal CLK2. CLK2 is a delayed version of CLK1. Resonant delay circuit 503 sets the phase of feedback clock signal CLK2 based on the filtered control signal VCF. Resonant delay circuit 503 adjusts the phase of CLK2 based on changes in filtered control signal VCF. DLL 500 adjusts the phase of feedback clock signal CLK2 until the phase of CLK2 is aligned with the phase of CLK1. CLK2 is an output clock signal of DLL circuit 500.

Figure 6:
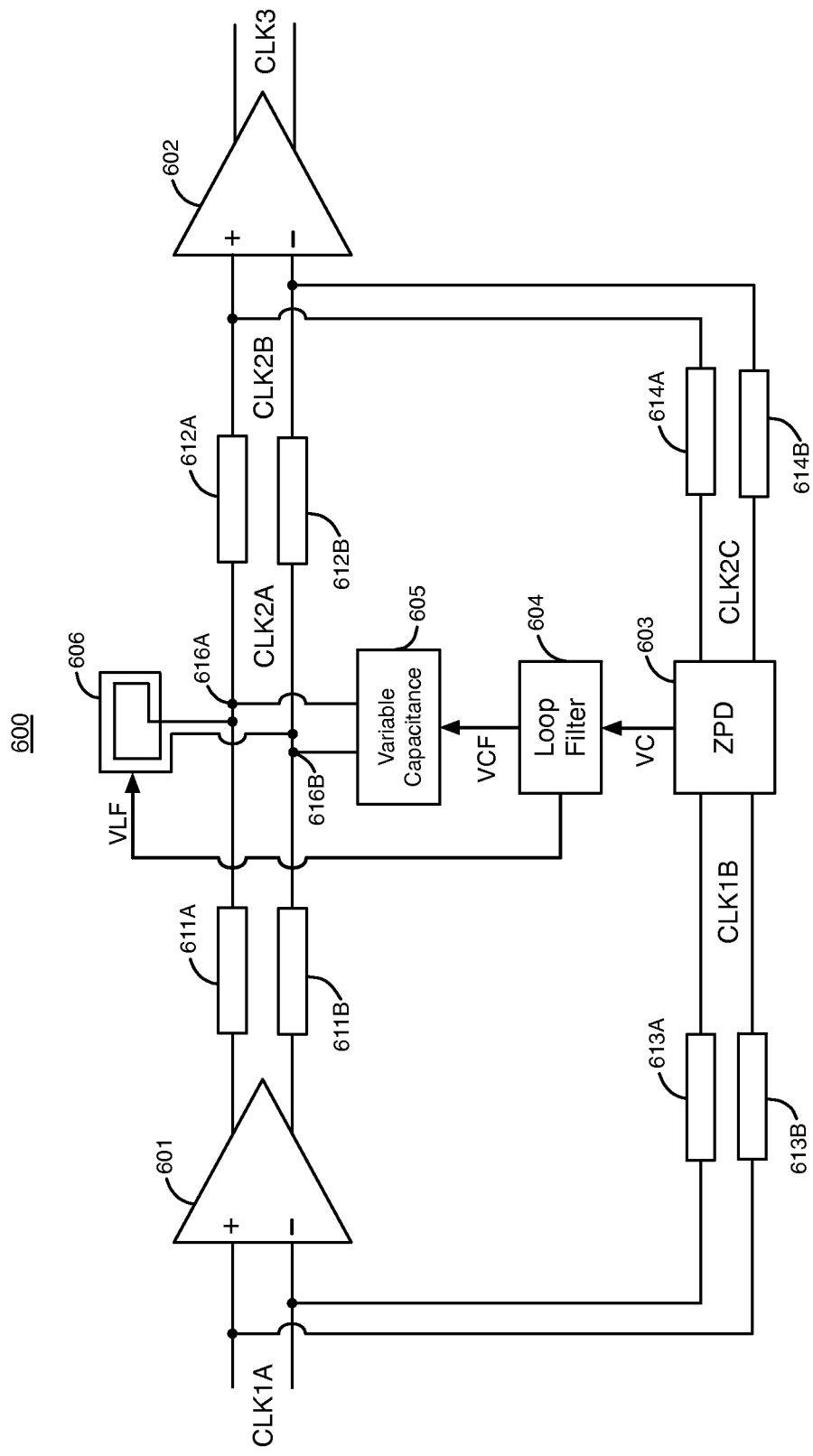
FIG. 6 illustrates an example of a differential signal distribution network coupled to a DLL that includes a resonant delay circuit.

FIG. 6 illustrates an example of a differential signal distribution network 600 coupled to a DLL that includes a resonant delay circuit. The delay-locked loop (DLL) of FIG. 6 includes buffer circuit 601, zero phase detector 603, loop filter circuit 604, variable capacitance circuit 605, and inductor 606. The DLL of FIG. 6 also includes differential transmission lines 612A-612B and 614A-614B in its feedback loop. The DLL in FIG. 6 removes or reduces a phase offset in a clock signal transmitted through signal distribution network 600.

Signal distribution network 600 includes buffer circuits 601-602, zero phase detector 603, loop filter circuit 604, variable capacitance circuit 605, inductor 606, and differential transmission lines 611A-611B, 612A-612B, 613A-613B, and 614A-614B. The signal distribution network of FIG. 6 can have multiple segments that are coupled together in a desired configuration. Each segment has one buffer circuit, circuits 603-606, and transmission lines 611A-614B coupled in the same configuration shown in FIG. 6. The segments in the signal distribution network of FIG. 6 can be repeated numerous times to achieve networks having any desired shape and length.

Buffer circuit 601 receives a first periodic differential clock signal CLK1A at its differential inputs. Buffer circuit 601 buffers the voltage of CLK1A to generate a buffered differential clock signal at its differential outputs. The buffered differential clock signal is transmitted through transmission lines 611A-611B to generate differential clock signal CLK2A. Clock signal CLK2A is transmitted through transmission lines 612A-612B to generate clock signal CLK2B at the differential inputs of buffer circuit 602. Transmission lines 612A-612B may cause clock signal CLK2B to have a phase offset relative to CLK2A. Buffer circuit 602 buffers the voltage of CLK2B to generate buffered differential clock signal CLK3 at its differential outputs.

Clock signal CLK1A is transmitted through transmission lines 613A-613B to generate differential clock signal CLK1B at first differential inputs of zero phase detector 603. Transmission lines 613A-613B may cause clock signal CLK1B to have a phase offset relative to CLK1A. Clock signal CLK2B is transmitted through transmission lines 614A-614B to generate differential clock signal CLK2C at second differential inputs of zero phase detector 603. Transmission lines 614A-614B may cause clock signal CLK2C to have a phase offset relative to CLK2B.

Zero phase detector (ZPD) 603 compares the phase of CLK2C to the phase of CLK1B. ZPD 603 generates a control signal VC (e.g., a control voltage) that is indicative of the phase difference between CLK1B and CLK2C. ZPD 603 varies control signal VC based on changes in the phase difference between CLK1B and CLK2C. The control signal VC generated by ZPD 603 is transmitted to an input of loop filter circuit 604.

Loop filter circuit 604 filters control signal VC to generate a filtered control signal VCF (e.g., a filtered control voltage). Filtered control signal VCF is transmitted to an input of variable capacitance circuit 605. The variable capacitance of circuit 605 is coupled between nodes 616A and 616B. Filtered control signal VCF sets the capacitance of variable capacitance circuit 605 between nodes 616A-616B. The capacitance of variable capacitance circuit 605 between nodes 616A-616B varies based on changes in filtered control signal VCF.

Inductor 606 is coupled across nodes 616A and 616B in parallel with the variable capacitance of circuit 605. Buffer 601, inductor 606, variable capacitance circuit 605, and transmission lines 611A-611B, 612A-612B are an example of a resonant delay circuit.

ZPD 603 and loop filter 604 change the capacitance of variable capacitance circuit 605 to cause adjustments in the phase of clock signal CLK2A. Each adjustment in the phase of CLK2A causes a corresponding adjustment in the phase of CLK2C. The DLL of FIG. 6 adjusts the capacitance of variable capacitance circuit 605 to cause the phase of CLK2C to be aligned with the phase of CLK1B. The DLL of FIG. 6 continues to provide phase adjustments to CLK2C until CLK2C is in phase with CLK1B.

The DLL of FIG. 6 drives the phase error between CLK1B and CLK2C to zero or approximately zero. The delay that transmission lines 613A-613B generate in clock signal CLK1B is set to equal the delay that transmission lines 614A-614B generate in clock signal CLK2C, hence the phase of CLK2B is aligned with the phase of CLK1A when the phases of CLK2C and CLK1B are in alignment.

The DLL circuit of FIG. 6 can be an analog DLL circuit or a digital DLL circuit. If the DLL of FIG. 6 is an analog DLL, loop filter 604 can include, for example, a charge pump that generates a control voltage based on output signals of ZPD 603. An analog loop filter 604 can also include a capacitor that low pass filters the charge pump control voltage. Variable capacitance circuit 605 can include one or more varactors that are coupled between nodes 616A-616B in analog DLL embodiments. The varactor can be, for example, a MOS varactor having a capacitance that varies based on changes in the filtered control voltage VCF from loop filter 604.

If the DLL of FIG. 6 is a digital DLL, loop filter 604 can be, for example, an accumulator circuit that performs an integration function to filter the control signal VC, and variable capacitance circuit 605 can include, for example, a bank of switched capacitors. The bank of switched capacitors includes several capacitors that each has a fixed capacitance. Each of the capacitors is coupled in series with a switch circuit. In this embodiment, loop filter 604 generates a set of digital control signals VCF that are transmitted in parallel to circuit 605. The conductive states of the switch circuits are controlled by the control signals VCF transmitted from loop filter 604. The DLL changes the capacitance of circuit 605 by changing the number of fixed capacitors that are coupled between nodes 616A and 616B. Each of the fixed capacitors can be coupled to or decoupled from nodes 616A-616B by changing the conductive state of the switch circuit coupled to that capacitor.

In an embodiment, inductor 606 has a variable inductance. Changes in the inductance of inductor 606 cause variations in the phases of clock signals CLK2A-CLK2C. In this embodiment, loop filter 604 generates one or more filtered signals VLF based on the control signal VC generated by ZPD 603. Signal(s) VLF control the inductance of inductor 606. ZPD 603 and loop filter 604 vary the inductance of inductor 606 using signal(s) VLF in order to drive the phase offset between CLK2C and CLK1B to zero. The inductance of inductor 606 can be varied using, for example, the variable inductance techniques described above with respect to inductor 212.

The DLL of FIG. 6 consumes less power and introduces less power supply induced jitter (PSIJ) into an output clock signal than a conventional DLL, because the DLL of FIG. 6 has only one buffer 601 in the delay path. The resonant circuit of FIG. 6 adds a negative phase offset into CLK2A so that the DLL can achieve phase lock between CLK1A and CLK2B without adding additional buffers in the delay path. Setting the quality factor Q of the resonant circuit to a higher value can reduce the size of the buffer 601 that is required to drive a given load.

Figure 7:
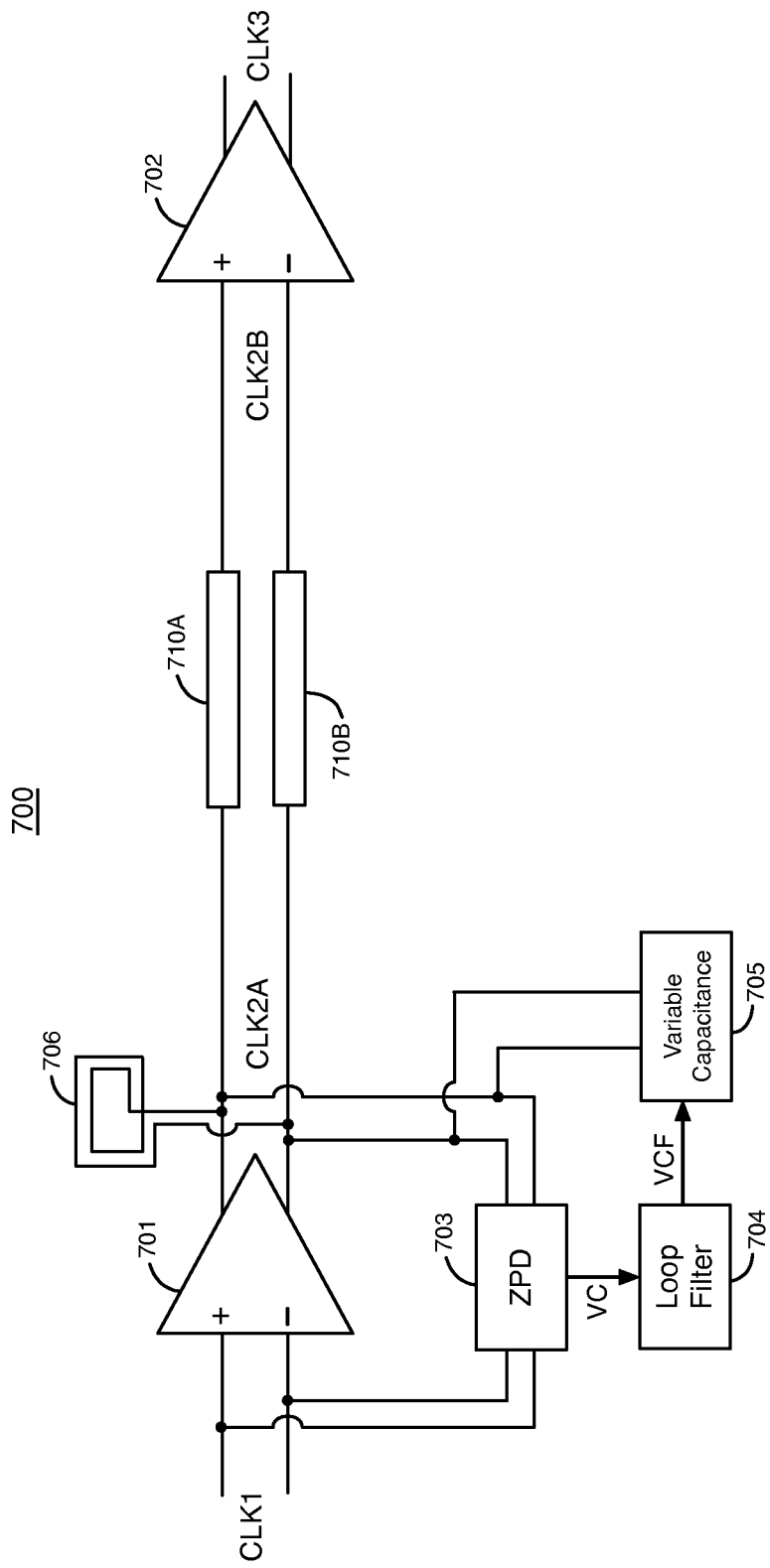
FIG. 7 illustrates another example of a differential signal distribution network coupled to a DLL that includes a resonant delay circuit.

FIG. 7 illustrates an example of a differential signal distribution network 700 coupled to a DLL that includes a resonant delay circuit. Signal distribution network 700 can be incorporated into a clock network having any desired layout or size. The DLL of FIG. 7 removes or reduces a phase offset in a clock signal transmitted through signal distribution network 700.

In the embodiment of FIG. 7, the DLL is closed locally around a buffer circuit in signal distribution network 700 and transmission lines are not included inside the feedback loop of the FIG. 7 DLL.

Signal distribution network 700 includes buffer circuits 701-702, zero phase detector (ZPD) circuit 703, loop filter circuit 704, variable capacitance circuit 705, inductor 706, and transmission lines 710A-710B. Signal distribution network 700 can have multiple segments that are coupled together in a desired configuration. Each segment has one buffer circuit, circuits 703-706, and transmission lines 710A-710B coupled in the configuration shown in FIG. 7. The segments in signal distribution network 700 can be repeated numerous times to achieve networks having any desired shape and length.

Buffer circuit 701 buffers the voltage of a first differential clock signal CLK1 at its differential inputs to generate a buffered differential clock signal CLK2A at its differential outputs. Clock signal CLK2A is transmitted through transmission lines 710A-710B to generate differential clock signal CLK2B. Transmission lines 710A-710B may cause clock signal CLK2B to have a phase offset relative to CLK2A. Buffer circuit 702 buffers the voltage of CLK2B to generate buffered differential clock signal CLK3 at its differential outputs.

The DLL of FIG. 7 includes buffer circuit 701, zero phase detector (ZPD) circuit 703, loop filter circuit 704, variable capacitance circuit 705, and inductor 706. ZPD 703 compares the phase of clock signal CLK2A to the phase of clock signal CLK1 to generate a control signal VC. Loop filter 704 filters VC to generate filtered control signal VCF. Signal VCF controls the capacitance of variable capacitance circuit 705. Variable capacitance circuit 705 is coupled between the outputs of buffer 701. Variable capacitance circuit 705 and inductor 706 are a resonant circuit. The DLL of FIG. 7 adjusts the phase of clock signal CLK2A until the phase of CLK2A is aligned with the phase of CLK1, as described above with respect to the DLL of FIG. 6. The DLL of FIG. 7 reduces or eliminates any phase offset between CLK1 and CLK2A.

The DLLs of FIGS. 6 and 7 can introduce a negative phase offset into the phase adjusted clock signal using a resonant circuit by tuning the resonant frequency of the resonant circuit to be greater than the frequency of the phase adjusted clock signal. The resonant circuit can be, for example, an inductor coupled in parallel with a variable capacitor, as described above.

Figure 8A:
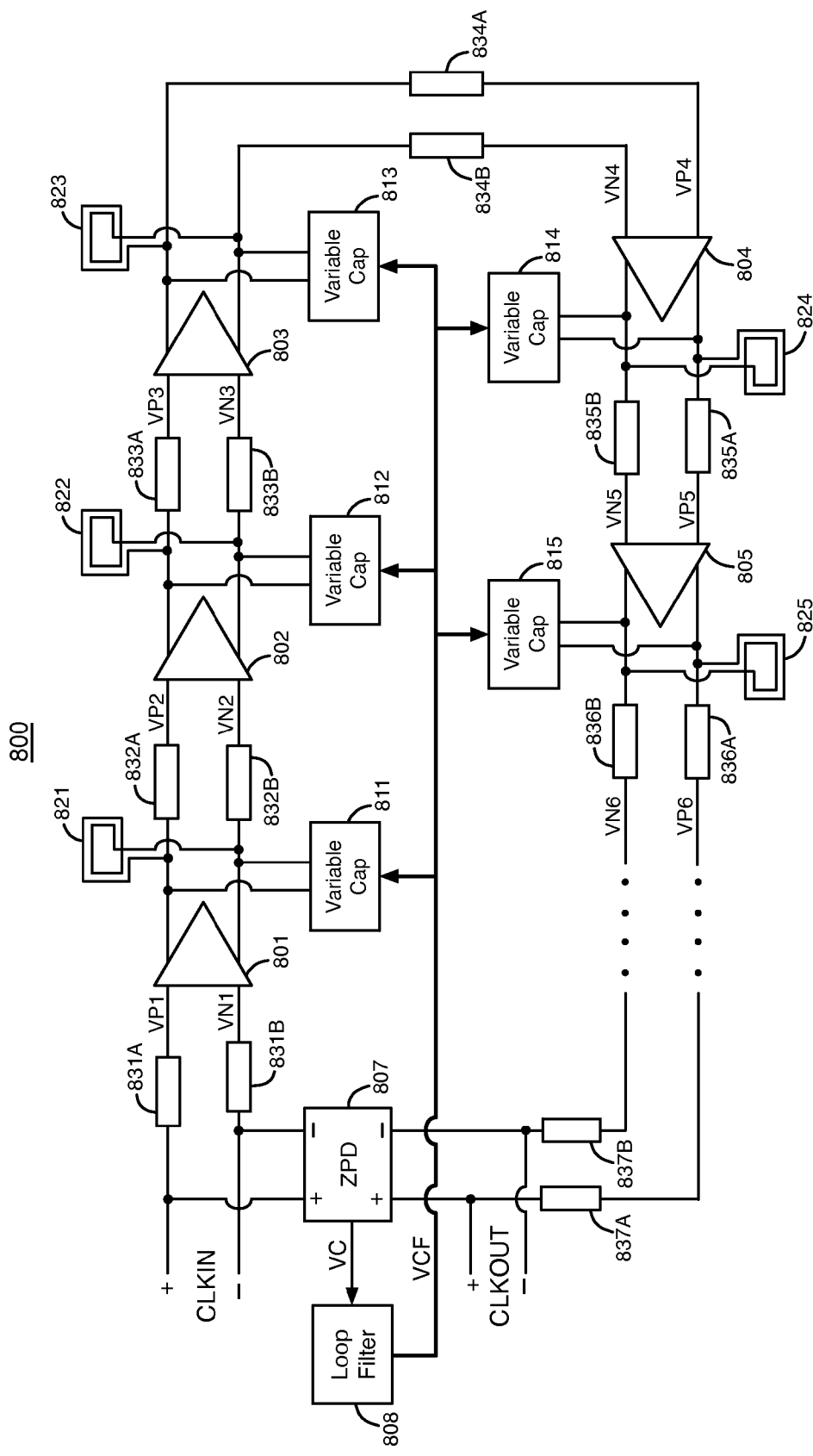
FIG. 8A illustrates an example of a differential signal distribution network coupled to a DLL circuit having resonant delay circuits that each introduce a positive phase offset in a clock signal transmitted through the network.

In some embodiments, a DLL in a signal distribution network introduces a positive phase offset into a clock signal transmitted through the network. FIG. 8A illustrates an example of a differential signal distribution network 800 coupled to a delay-locked loop (DLL) circuit having multiple resonant delay circuits that each introduce a positive phase offset in a clock signal transmitted through the network.

Signal distribution network 800 can include any desired number of segments. Each segment includes a buffer, a variable capacitance circuit, an inductor, and transmission lines. Five segments are shown in FIG. 8A as an example. FIG. 8A shows buffer circuits 801-805, zero phase detector (ZPD) circuit 807, loop filter circuit 808, variable capacitance circuits 811-815, inductors 821-825, and parallel transmission lines 831A-837B. The DLL in network 800 includes all of the circuits in signal distribution network 800.

Buffer circuits 801-805 are coupled together in series by differential transmission lines 832A-835B along the length of signal distribution network 800. Buffer circuits 801-805 delay a differential input clock signal CLKIN to generate a differential output clock signal CLKOUT.

Differential input clock signal CLKIN is transmitted to the differential inputs of buffer circuit 801 through transmission lines 831A-831B and to first differential inputs of ZPD 807. Differential voltage VP1-VN1 is a delayed version of CLKIN.

The output voltages VP2/VN2, VP3/VN3, VP4/VN4, VP5/VN5, and VP6/VN6 of buffer circuits 801-805, respectively, represent differential clock signals. Each of the buffer circuits 801-805 generates a differential clock signal in response to the differential clock signal received at its inputs. One of the buffer circuits (e.g., buffer 805) drives the output clock signal CLKOUT that is transmitted to second differential inputs of ZPD 807 through transmission lines 837A-837B, as shown in FIG. 8A.

ZPD 807 compares the phase of CLKOUT to the phase of CLKIN to generate control signal VC. ZPD 807 varies the control signal VC based on changes in the phase difference between CLKIN and CLKOUT. Loop filter 808 filters control signal VC to generate one or more filtered signals VCF. Variations in signal VC are represented by variations in signals VCF. Filtered signals VCF are transmitted to the inputs of variable capacitance circuits 811-815.

The variable capacitance circuits 811-815 generate variable capacitances between the outputs of buffers 801-805, respectively. The inductors 821-825 are coupled between the outputs of buffers 801-805, respectively. Variable capacitance circuits 811-815 and inductors 821-825 form resonant circuits in the 5 segments shown in FIG. 8A.

The capacitances of variable capacitance circuits 811-815 vary based on changes in the one or more filtered control signals VCF. For example, the number of switched capacitors coupled to the transmission lines in each of the circuits 811-815 may vary based on changes in the logic states of a set of digital control signals VCF in a digital DLL embodiment. As another example, the capacitance of one or more varactors in each of the circuits 811-815 may vary based on changes in a filtered analog control signal VCF in an analog DLL embodiment. Changes in the capacitances of variable capacitance circuits 811-815 cause changes in the phase of clock signal CLKOUT.

As shown in FIG. 8A, the polarity of CLKOUT as applied to the second inputs of ZPD 807 is the same as the polarity of CLKIN as applied to the first inputs of ZPD 807. As a result, the DLL in network 800 drives the phase difference between CLKIN and CLKOUT to a multiple of a period T of CLKIN and CLKOUT (e.g., T, 2T, 3T, etc.). The sum of the phase offsets of the resonant delay circuits in network 800 equals one or more periods of CLKIN when the DLL is in lock.

The embodiment of FIG. 8A can be used in any appropriate application. For example, the embodiment of FIG. 8A can be used for beam forming in a radio frequency transceiver application.

According to an alternative embodiment, inductors 821-825 have variable inductances. The DLL of FIG. 8A can vary the inductances of inductors 821-825 to adjust the phase of CLKOUT, until CLKOUT is aligned in phase with CLKIN.

Figure 8B:
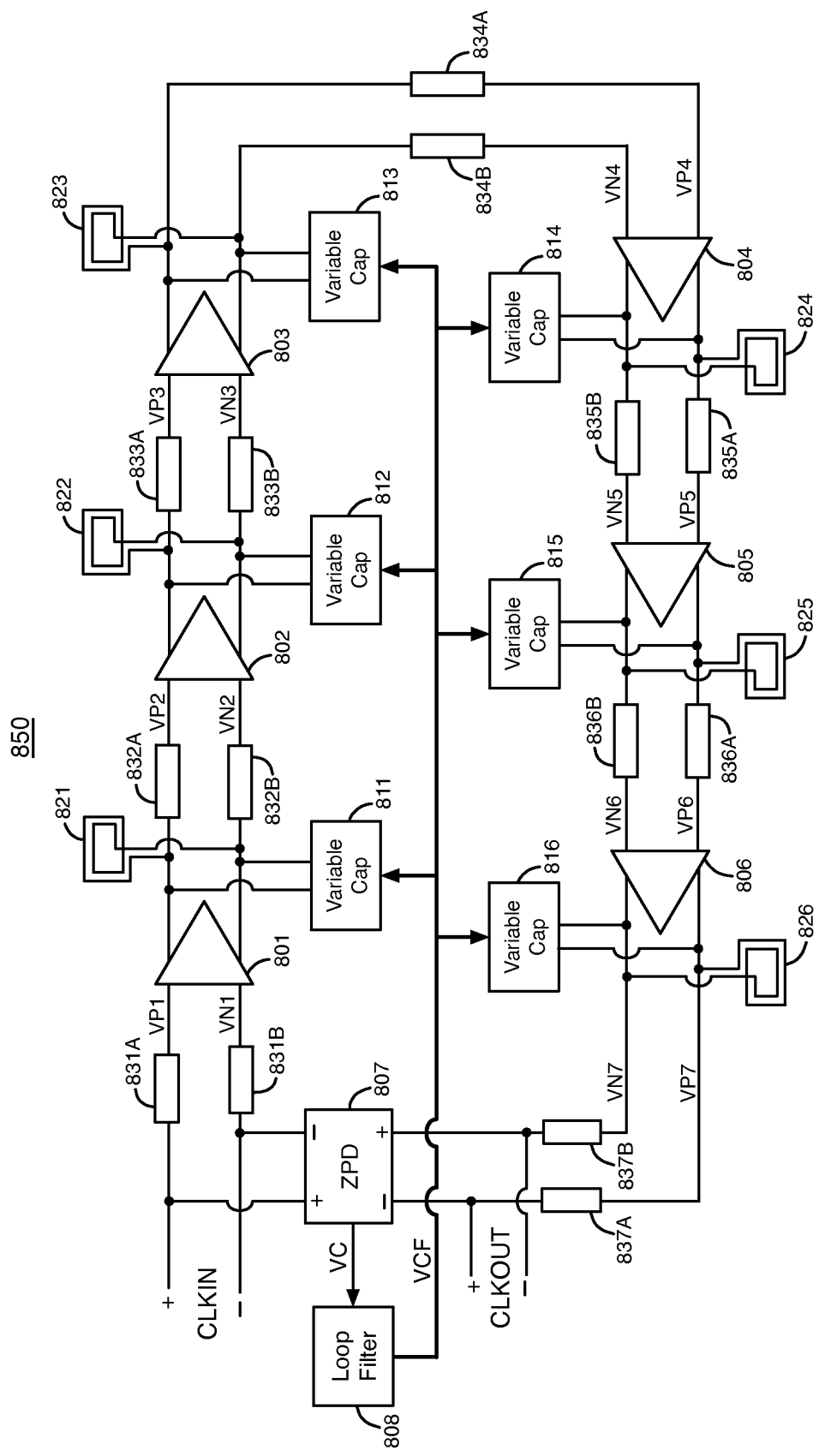
FIG. 8B illustrates another example of a differential signal distribution network coupled to a DLL circuit having resonant delay circuits that each introduce a positive phase offset in a clock signal transmitted through the network.

FIG. 8B illustrates another example of a differential signal distribution network 850 coupled to a DLL circuit having resonant delay circuits that each introduce a positive phase offset in a clock signal transmitted through the network. The DLL of FIG. 8B is a specific implementation of the DLL of FIG. 8A where signal distribution network 850 has six resonant delay circuits. Differential signal distribution network 850 drives a phase offset between an input clock signal CLKIN and an output clock signal CLKOUT to 180°. Each of the resonant delay circuits in network 850 adds a positive phase offset to CLKOUT.

The DLL in signal distribution network 850 includes all of the circuits in network 800 of FIG. 8A and one additional segment. Signal distribution network 850 has 6 segments. Signal distribution network 850 includes buffer circuits 801-806, zero phase detector (ZPD) circuit 807, loop filter circuit 808, variable capacitance circuits 811-816, inductors 821-826, and parallel transmission lines 831A-837B. The DLL in network 850 includes all of the circuits in signal distribution network 850.

Buffer circuit 806, variable capacitance circuit 816, and inductor 826 generate differential voltage VP7/VN7 in response to VP6/VN6. The capacitance of variable capacitance circuit 816 varies based on changes in filtered control signals VCF. Transmission lines 837A-837B delay VP7 and VN7 to generate clock signal CLKOUT.

As shown in FIG. 8B, the polarity of CLKOUT as applied to the second inputs of ZPD 807 is reversed with respect to the polarity of CLKIN as applied to the first inputs of ZPD 807. As a result, the DLL of FIG. 8B drives the phase difference between CLKOUT and CLKIN to 180°. 180° refers to half a period of CLKIN. ZPD 807 varies control signal VC to adjust the phase of CLKOUT with respect to the phase of CLKIN, until CLKOUT is 180° out of phase with CLKIN. When CLKOUT is 180° out of phase with CLKIN, ZPD 807 maintains control signal VC at a constant value to cause the phase of CLKOUT to remain at a constant phase.

When CLKOUT is 180° out of phase with CLKIN, the DLL is in lock. When the DLL is in lock, each of the 6 segments of signal distribution network 850 generates a positive phase offset of 30° in CLKOUT, because each of the 6 segments contains identical circuits. To obtain the unique positive 30 degrees phase offset, the initial setting is close. The DLL is used to set exactly 30 degrees in a small tuning range. The 6 segments of signal distribution network 850 together generate the 180° phase shift in CLKOUT with respect to CLKIN when the DLL is in lock. According to an alternative embodiment, each segment of the network can generate a negative phase offset of 30 degrees in CLKOUT, if the tuning range of the resonant network is wide.

Figure 9:
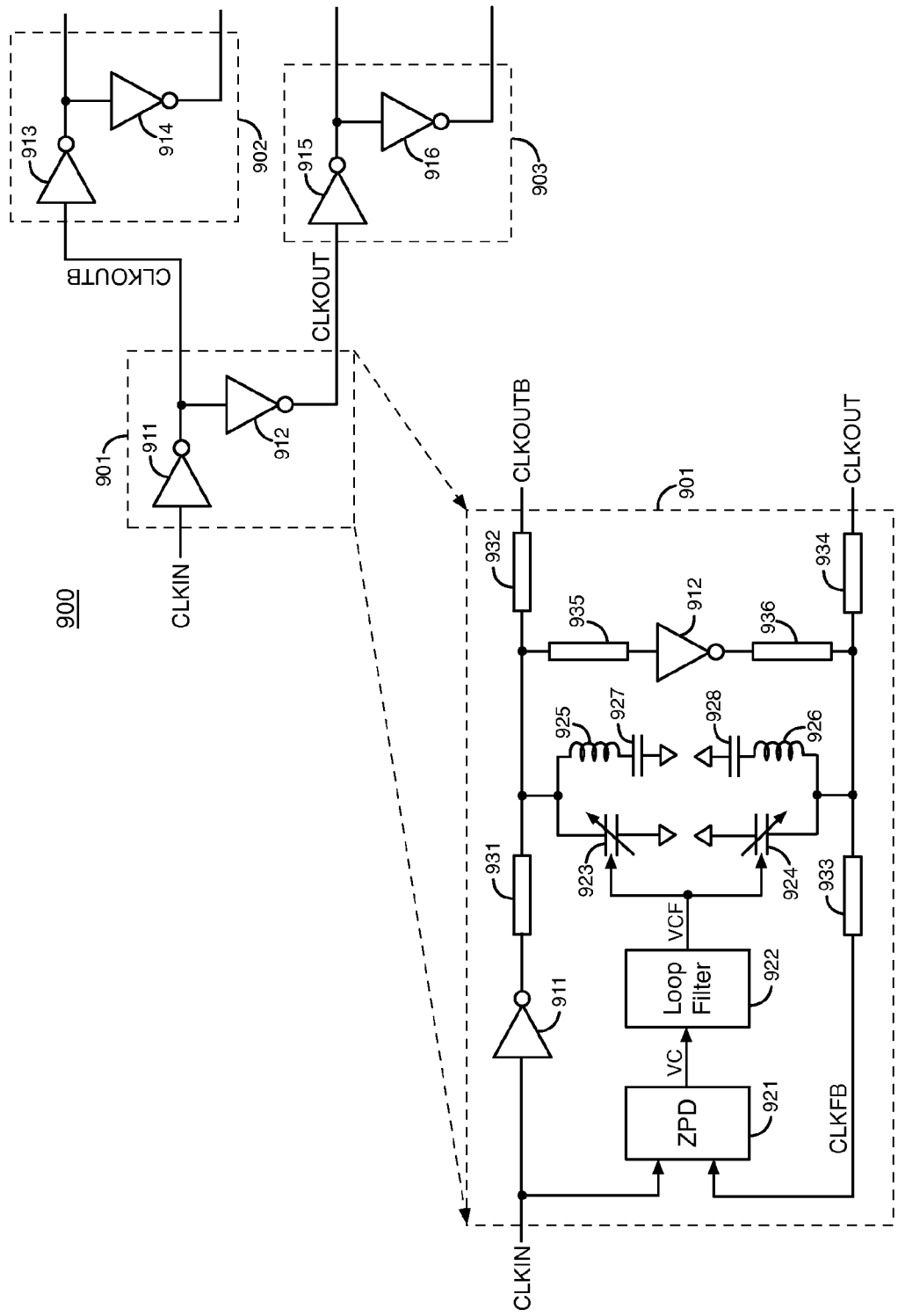
FIG. 9 illustrates an example of a single-ended signal distribution network having a delay-locked loop (DLL) with resonant delay circuits that reduce phase offsets in a clock signal transmitted through the network.

FIG. 9 illustrates an example of a single-ended signal distribution network 900 having a delay-locked loop (DLL) that removes or reduces phase offsets in a clock signal transmitted through the network. The DLL of FIG. 9 is a closed feedback loop that includes two resonant circuits.

Single-ended signal distribution network 900 can have numerous segments, including segments 901-903 shown in FIG. 9. Segment 901 includes inverting buffers 911-912, segment 902 includes inverting buffers 913-914, and segment 903 includes inverting buffers 915-916.

Segment 901 generates complementary output clock signals CLKOUT and CLKOUTB in response to an input clock signal CLKIN. Inverting buffer 911 inverts CLKOUTB with respect to CLKIN. Inverting buffer 912 inverts CLKOUT with respect to CLKOUTB. CLKOUTB is transmitted to an input of segment 902, and CLKOUT is transmitted to an input of segment 903.

Each of the segments of network 900 includes a DLL having a resonant delay circuit. Further details of segment 901 in network 900 are shown in FIG. 9. Segment 901 has a zero phase detector (ZPD) 921, a loop filter circuit 922, variable capacitance circuits 923-924, inductors 925-926, capacitors 927-928, inverting buffers 911-912, and single-ended transmission lines 931-936. Each of the other segments of network 900 includes the same circuit components shown for segment 901 in FIG. 9.

ZPD 921 compares the phase of single-ended input clock signal CLKIN to the phase of a single-ended feedback clock signal CLKFB to generate a control signal VC. ZPD 921 varies control signal VC based on changes in the phase difference between CLKIN and CLKFB. The DLL of segment 901 drives the phase difference between CLKIN and CLKFB to zero.

Loop filter 922 filters control signal VC to generate a filtered control signal VCF. Filtered control signal VCF controls the capacitances of variable capacitance circuits 923 and 924. Variable capacitance circuits 923 and 924 can be, for example, varactors or switched capacitors.

Variable capacitance circuit 923 is coupled in parallel with inductor 925 and capacitor 927. Variable capacitance circuit 923, inductor 925, and capacitor 927 form a first resonant circuit. Variable capacitance circuit 924 is coupled in parallel with inductor 926 and capacitor 928. Variable capacitance circuit 924, inductor 926, and capacitor 928 form a second resonant circuit. In an alternative embodiment, inductors 925 and 926 have variable inductances that are controlled by a filtered output signal of ZPD 921. In another alternative embodiment, capacitors 927 and 928 have variable capacitances that are controlled by a filtered output signal of ZPD 921.

The DLL of segment 901 varies the capacitances of variable capacitance circuits 923 and 924 to adjust the phase of feedback clock signal CLKFB. The DLL adjusts the phase of CLKFB until the phases of CLKIN and CLKFB are aligned. The DLL in segment 901 is in lock when CLKIN and CLKFB are aligned in phase.

Changes in the capacitances of variable capacitance circuits 923 and 924 also cause changes in the phases of output clock signals CLKOUTB and CLKOUT. If the delay of transmission line 934 equals the delay of transmission line 933, then the phase of CLKOUT is aligned with the phase of CLKIN when the DLL in segment 901 is in lock. The delays of transmission lines 932 and 934-936 and inverting buffer 912 are selected to cause CLKOUT to be 180° out of phase with CLKOUTB.

The signal distribution networks described herein can be used in any suitable integrated circuit (IC), such as, for example, a memory IC, a controller IC, a processor IC, an analog IC, a digital IC, a programmable IC, etc.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. A circuit comprising segments coupled together to form a signal distribution network, wherein each of the segments comprises:
   a buffer circuit;
   a first transmission line coupled to the buffer circuit;
   an inductor coupled to the buffer circuit through the first transmission line; and
   a variable capacitance circuit coupled to the inductor and coupled to the buffer circuit through the first transmission line, wherein a capacitance of the variable capacitance circuit is set to determine a phase and an amplitude of a signal transmitted through the first transmission line.

2. The circuit of claim 1 wherein the variable capacitance circuit in each of the segments is coupled to a buffer circuit in an adjacent segment through a second transmission line.

3. The circuit of claim 1 wherein the signal distribution network is a differential signal distribution network that comprises a second transmission line coupled to the buffer circuit, the inductor, and the variable capacitance circuit.

4. The circuit of claim 1 wherein the signal distribution network is a single-ended signal distribution network.

5. The circuit of claim 1 wherein the capacitance of the variable capacitance circuit is set to a capacitance that causes an output signal of the buffer circuit to have a zero phase offset relative to an input signal of the buffer circuit.

6. The circuit of claim 1 wherein a gain of the buffer circuit is adjustable.

7. The circuit of claim 6 wherein each of the segments further comprises:
   an amplitude detector circuit that adjusts the gain of the buffer circuit based on changes in an output signal of the buffer circuit.

8. The circuit of claim 6 wherein each of the segments further comprises:
   an amplitude comparator circuit that adjusts the gain of the buffer circuit based on changes in a difference between an output signal of the buffer circuit and an output signal of a previous segment of the signal distribution network.

9. The circuit of claim 1 wherein at least one of the segments of the signal distribution network comprises a delay-locked loop circuit, and wherein the delay-locked loop circuit comprises the buffer circuit, the first transmission line, the inductor, the variable capacitance circuit, a phase detector coupled to the buffer circuit, and a loop filter coupled to the phase detector and the variable capacitance circuit.

10. The circuit of claim 1 wherein the circuit comprises at least three of the segments coupled together in the signal distribution network.

11. The circuit of claim 1 wherein the inductor is coupled in parallel with the variable capacitance circuit.

12. The circuit of claim 11 wherein a resonant frequency of the inductor, the variable capacitance circuit, and the first transmission line is set to a frequency that is greater than a frequency of a clock signal transmitted through the first transmission line.

13. The circuit of claim 1 wherein the signal distribution network comprises a clock distribution network.

14. The circuit of claim 1 wherein the circuit is embedded in an integrated circuit die.

15. A circuit comprising a signal distribution network, wherein the signal distribution network comprises:
   a phase detector that compares a phase of a first periodic signal to a phase of a second periodic signal;
   a loop filter circuit coupled to the phase detector; and
   a first resonant delay circuit coupled to the loop filter circuit and coupled to the phase detector, wherein the first resonant delay circuit comprises a variable impedance circuit having an impedance that varies based on changes in an output signal of the loop filter circuit.

16. The circuit of claim 15 wherein the variable impedance circuit comprises a circuit having a variable capacitance.

17. The circuit of claim 16 wherein the first resonant delay circuit further comprises an inductor coupled to the circuit having the variable capacitance.

18. The circuit of claim 15 wherein the first resonant delay circuit comprises an inductor.

19. The circuit of claim 15 wherein the first resonant delay circuit comprises a buffer circuit, an inductor, and a variable capacitance circuit.

20. The circuit of claim 15 wherein the phase detector adjusts a delay of the first resonant delay circuit to reduce skew between phases of the first and the second periodic signals.

21. The circuit of claim 15 wherein the loop filter circuit is an accumulator, and wherein the phase detector is a zero phase detector.

22. The circuit of claim 15 wherein the signal distribution network is embedded in an integrated circuit.

23. The circuit of claim 15 wherein the first resonant delay circuit comprises a first buffer circuit, and wherein the signal distribution network further comprises:
   a second resonant delay circuit coupled to the loop filter circuit, wherein the second resonant delay circuit comprises a second buffer circuit coupled to the first buffer circuit.

24. The circuit of claim 23 wherein the signal distribution network further comprises:
   a third resonant delay circuit coupled to the loop filter circuit, wherein the third resonant delay circuit comprises a third buffer circuit coupled to the second buffer circuit.

25. The circuit of claim 24 wherein the signal distribution network further comprises:
   fourth, fifth, and sixth resonant delay circuits coupled in series, coupled to the third resonant delay circuit, and coupled to the loop filter circuit.

26. The circuit of claim 23 wherein the signal distribution network further comprises:
   an Nth resonant delay circuit coupled to the loop filter circuit, wherein the Nth resonant delay circuit comprises an Nth buffer circuit that is coupled to the phase detector.

27. The circuit of claim 15 wherein the signal distribution network comprises a delay-locked loop circuit.

28. The circuit of claim 15 wherein a resonant frequency of the first resonant delay circuit is set to a frequency that is greater than frequencies of the first and the second periodic signals.

29. The circuit of claim 15 wherein the signal distribution network comprises a first single-ended transmission line coupled to the phase detector, and a second single-ended transmission line coupled to the first resonant delay circuit.

30. The circuit of claim 15 wherein the signal distribution network comprises differential transmission lines coupled to the phase detector.

31. A method for transmitting a periodic signal through a signal distribution network having segments that are coupled together, the method comprising:
   buffering the periodic signal in each of the segments to generate a buffered periodic signal;
   transmitting the buffered periodic signal through a first transmission line in each of the segments; and
   setting a capacitance of a variable capacitance circuit in each of the segments to select a phase and an amplitude of the buffered periodic signal, wherein the variable capacitance circuit is coupled to an inductor in each of the segments.

32. The method of claim 31 further comprising:
   transmitting the buffered periodic signal through a second transmission line in each of the segments.

33. The method of claim 31 wherein a resonant frequency of the variable capacitance circuit, the inductor, and the first transmission line in each of the segments is greater than the frequency of the buffered periodic signal.

34. The method of claim 31 wherein the signal distribution network comprises at least three of the segments.

35. The method of claim 31 wherein the inductor in each of the segments is coupled in parallel with the variable capacitance circuit.

36. The method of claim 31 wherein the signal distribution network is differential, wherein buffering the periodic signal in each of the segments to generate a buffered periodic signal further comprises buffering the periodic signal in each of the segments to generate a differential buffered periodic signal, and wherein transmitting the buffered periodic signal through a first transmission line in each of the segments further comprises transmitting the differential buffered periodic signal through first and second transmission lines in each of the segments.

37. The method of claim 31 wherein the signal distribution network is single-ended.

38. The method of claim 31 wherein the capacitance of the variable capacitance circuit is set to a capacitance that causes the buffered periodic signal to have a zero phase offset relative to the periodic signal.

39. A method for controlling a phase of a periodic signal transmitted through a signal distribution network, wherein the method comprises:
   comparing a phase of a first periodic signal with a phase of a second periodic signal to generate a first phase comparison signal;
   filtering the first phase comparison signal to generate a first filtered signal; and
   setting a first variable impedance in a first resonant delay circuit based on the first filtered signal to determine the phase of the second periodic signal.

40. The method of claim 39 wherein setting a first variable impedance in a first resonant delay circuit based on the first filtered signal to determine the phase of the second periodic signal further comprises setting a capacitance of a variable capacitance circuit in the first resonant delay circuit, and wherein the variable capacitance circuit is coupled to an inductor.

41. The method of claim 39 further comprising:
comparing the phase of the second periodic signal with a phase of a third periodic signal to generate a second phase comparison signal;
filtering the second phase comparison signal to generate a second filtered signal; and
setting a second variable impedance in a second resonant delay circuit based on the second filtered signal to determine the phase of the third periodic signal.

42. The method of claim 41 wherein setting a second variable impedance in a second resonant delay circuit based on the second filtered signal to determine the phase of the third periodic signal further comprises setting a capacitance of a variable capacitance circuit in the second resonant delay circuit, and wherein the variable capacitance circuit is coupled to an inductor.

43. The method of claim 39 wherein a resonant frequency of the first variable impedance combined with a transmission line is greater than frequencies of the first and the second periodic signals.

* * * * *